US 6,558,963 B1

(12) United States Patent
Evans et al.

(10) Patent No.: US 6,558,963 B1
(45) Date of Patent: May 6, 2003

(54) METHOD AND SYSTEM FOR CONTROLLING THE PLASMA TREATMENT OF A TITANIUM NITRIDE LAYER FORMED BY A CHEMICAL VAPOR DEPOSITION PROCESS

(75) Inventors: Allen Lewis Evans, Austin, TX (US); H. Jim Fulford, Austin, TX (US)

(73) Assignee: Advanced Micro Devices, Inc., Austin, TX (US)

( * ) Notice: Subject to any disclaimer, the term of this patent is extended or adjusted under 35 U.S.C. 154(b) by 69 days.

(21) Appl. No.: 09/625,711

(22) Filed: Jul. 25, 2000

(51) Int. Cl.[7] .............................................. H01L 21/66
(52) U.S. Cl. ......................... 438/14; 438/680; 438/648
(58) Field of Search ........................... 438/785, 14, 16, 438/680, 648, 656, 681

(56) References Cited

U.S. PATENT DOCUMENTS

| | | | | |
|---|---|---|---|---|
| 5,254,830 A | * | 10/1993 | Zarowin et al. | 219/121.43 |
| 5,844,684 A | * | 12/1998 | Maris et al. | 356/432 |
| 6,162,488 A | * | 12/2000 | Gevelber et al. | 427/8 |
| 6,348,967 B1 | * | 2/2002 | Nelson et al. | 356/432 |

FOREIGN PATENT DOCUMENTS

| | | |
|---|---|---|
| EP | 0053854 | 6/1982 |
| WO | 9729518 | 8/1997 |

OTHER PUBLICATIONS

Jun Pei, et al., "In situ thin film thickness measurement with acoustic Lamb waves" App. Phys. Lett. vol. 66, No. 17 (Apr. 1995) pp. 2177–2179.*
Abstract of Japan 09266311 (Oct. 7, 1997).

* cited by examiner

*Primary Examiner*—Caridad Everhart
(74) *Attorney, Agent, or Firm*—Williams, Morgan & Amerson, P.C.

(57) ABSTRACT

In general, the present invention is directed to a method of forming titanium nitride layers. In one illustrative embodiment, the method comprises forming a layer of titanium nitride by a chemical vapor deposition process, sensing a thickness of the layer of titanium nitride, and providing the sensed thickness of the layer of titanium nitride to a controller. The method further comprises determining at least one parameter of a plasma process to be performed on the layer of titanium nitride based upon the sensed thickness of the layer of titanium nitride and performing the plasma process comprised of the determined at least one parameter on the layer of titanium nitride.

23 Claims, 4 Drawing Sheets

(Prior Art)

METHOD AND SYSTEM FOR CONTROLLING THE PLASMA TREATMENT OF A TITANIUM NITRIDE LAYER FORMED BY A CHEMICAL VAPOR DEPOSITION PROCESS

BACKGROUND OF THE INVENTION

1. Field of the Invention

The present invention is directed to the field of semiconductor processing, and, more particularly, to a method of forming titanium nitride layers on a semiconductor device.

2. Description of the Related Art

Figure 1:
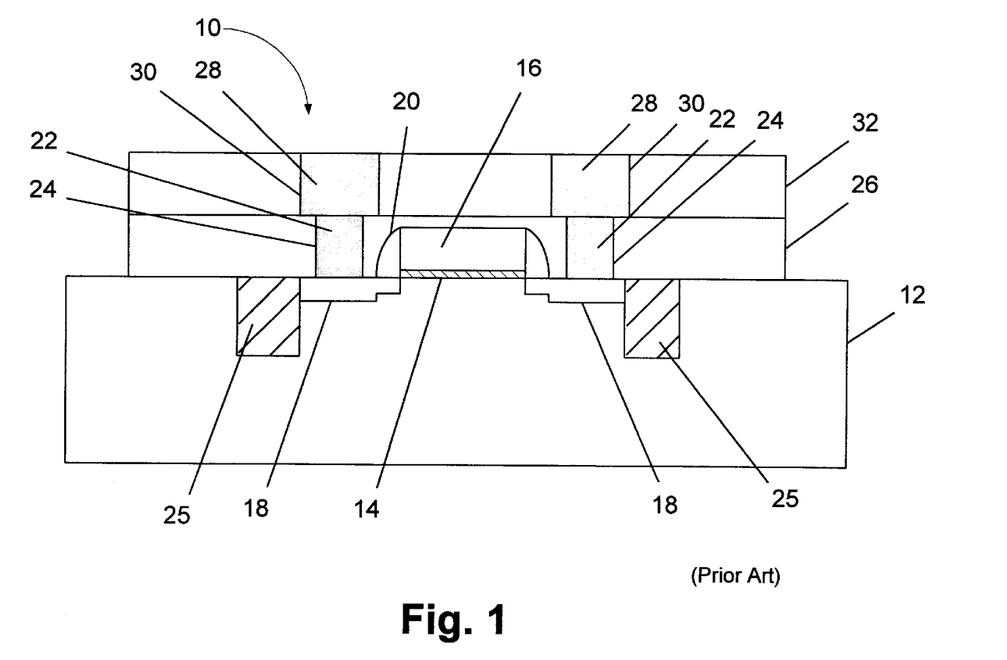
FIG. 1 is a cross-sectional view of an illustrative prior art transistor.

There is a constant drive within the semiconductor industry to increase the operating speed of integrated circuit devices, e.g., microprocessors, memory devices, etc. This drive is fueled by consumer demands for computers and electronic devices that operate at increasingly greater speeds. By way of background, an illustrative transistor 10 that may be included in such an integrated circuit device is shown in FIG. 1. The transistor 10 is generally comprised of a gate dielectric 14, a gate conductor 16, a plurality of source/drain regions 18 formed in a semiconducting substrate 12. The gate dielectric 14 may be formed from a variety of dielectric materials, such as silicon dioxide. The gate conductor 16 may also be formed from a variety of materials, such as polysilicon. The source and drain regions 18 may be formed by one or more ion implantation processes in which a dopant material is implanted into the substrate 12.

Next, a first dielectric layer 26 is formed above the transistor 10, and a plurality of vias or openings 24 are formed in the first dielectric layer 26. Thereafter, the vias 24 are filled with a conductive material, such as a metal, to form contacts or plugs 22. The contacts 22 are electrically coupled to the source and drain regions 18 of the transistor 10. Thereafter, a second dielectric layer 32 may be formed above the first dielectric layer 26. Multiple openings 30 may be formed in the second dielectric layer 32, and the openings 30 may thereafter be filled with a conductive material to form conductive lines 28. This interconnected network of contacts and lines allows electrical signals to propagate throughout the integrated circuit device. The techniques used for forming the various components depicted in FIG. 1 are known to those skilled in the art and will not be repeated here in detail.

A conventional integrated circuit device, such as a microprocessor, is typically comprised of many thousands of semiconductor devices, e.g., transistors, formed above the surface of a semiconducting substrate. One factor that affects the speed at which integrated circuit products operate is the speed at which electrical signals propagate through the device. Electrical signals travel within the device along the interconnected network of conductive lines and contacts. The greater the resistance of these lines and contacts, the slower the signals will propagate through the integrated circuit device, and the slower it will operate.

Many modern integrated circuit devices are very densely packed, i.e., there is very little space between the transistors formed above the substrate. Thus, these conductive interconnections must be made in multiple layers to conserve plot space on the semiconducting substrate. This is typically accomplished through the formation of a plurality of conductive lines and conductive plugs located in layers of dielectric materials formed on the device. The conductive lines and plugs may be made of a variety of conductive materials, such as copper, aluminum, aluminum alloys, titanium, tantalum, titanium nitride, tantalum nitride, tungsten, etc.

Considerable effort goes into sizing, routing and selecting the appropriate materials for this vast collection of interconnections in an effort to minimize the resistance of the contacts and lines in the device such that device performance, i.e., speed, is optimized or at least suitable for the design parameters of the particular product under construction. To form these conductive interconnections, i.e., lines and plugs, a layer of insulating material, such as silicon dioxide, is formed above the substrate or some other previously formed structure, i.e., another level of interconnections. Thereafter, openings are formed in the insulation layer by performing an etching process. Prior to forming a conductive line or plug in the opening, one or more barrier layers are formed in the opening. The purpose of the barrier layers is to, among other things, prevent migration of the metal used to form the conductive plug or line into the insulation layer.

In many situations, a combination of a layer of titanium nitride (TiN) and a layer of tungsten (W) is commonly employed to form this barrier layer. The purpose of the layer of titanium nitride is to, among other things, provide a better surface for the layer of tungsten to adhere to. Typically, the layer of titanium nitride is formed by a chemical vapor deposition ("CVD") process, and it is subsequently subjected to a plasma treatment to remove certain residual materials from the layer of titanium nitride. These residual materials may include carbon, which is a remnant of certain precursor materials used to form the layer of titanium nitride.

The duration and temperature of the plasma treatment process performed on the titanium nitride layer is a function of the thickness of the titanium nitride layer. However, if the duration of the plasma treatment is too long or too short, the resistance of the layer of titanium nitride increases. This, in turn, results in a net increase in the overall resistance of the conductive contact or line. Moreover, as with most layers of material formed in a semiconductor fabrication facility, the thickness of a layer of titanium nitride may vary due to a variety of factors, e.g., variations in precursor materials, variations from one CVD tool to the next, etc. As a result, performing a standard plasma treatment on the titanium nitride layer based upon an assumed thickness of the layer of titanium nitride may be problematic when the layer of titanium nitride, as manufactured, is thinner or thicker than anticipated. That is, when the layer of titanium nitride is thicker or thinner than anticipated, performing a plasma treatment designed for an assumed thickness of the layer may result in increasing the resistance of the layer of titanium nitride. In turn, this increased resistance may tend to result in slower device performance.

The present invention is directed to a method of manufacturing semiconductor device that minimizes or reduces some or all of the aforementioned problems.

SUMMARY OF THE INVENTION

In general, the present invention is directed to a method of forming titanium nitride layers. In one illustrative embodiment, the method comprises forming a layer of titanium nitride by a chemical vapor deposition process, sensing a thickness of the layer of titanium nitride, and providing the sensed thickness of the layer of titanium nitride to a controller. The method further comprises determining at least one parameter of a plasma process to be performed on the layer of titanium nitride based upon the sensed thickness of the layer of titanium nitride and performing the plasma process comprised of the determined at least one parameter on the layer of titanium nitride.

BRIEF DESCRIPTION OF THE DRAWINGS

The invention may be understood by reference to the following description taken in conjunction with the accompanying drawings, in which like reference numerals identify like elements, and in which.

While the invention is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION OF THE INVENTION

Illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present invention will now be described with reference to FIGS. 2–5. Although the various regions and structures of a semiconductor device are depicted in the drawings as having very precise, sharp configurations and profiles, those skilled in the art recognize that, in reality, these regions and structures are not as precise as indicated in the drawings. Additionally, the relative sizes of the various features depicted in the drawings may be exaggerated or reduced as compared to the size of those feature sizes on fabricated devices. Nevertheless, the attached drawings are included to describe and explain illustrative examples of the present invention.

In general, the present invention is directed to a method and system for controlling the plasma treatment of a titanium nitride layer formed by a chemical vapor deposition process. As will be readily apparent to those skilled in the art upon a complete reading of the present application, the present method is applicable to a variety of technologies, e.g., NMOS, PMOS, CMOS, etc., and is readily applicable to a variety of devices, including, but not limited to, logic devices, memory devices, etc.

Figure 2:
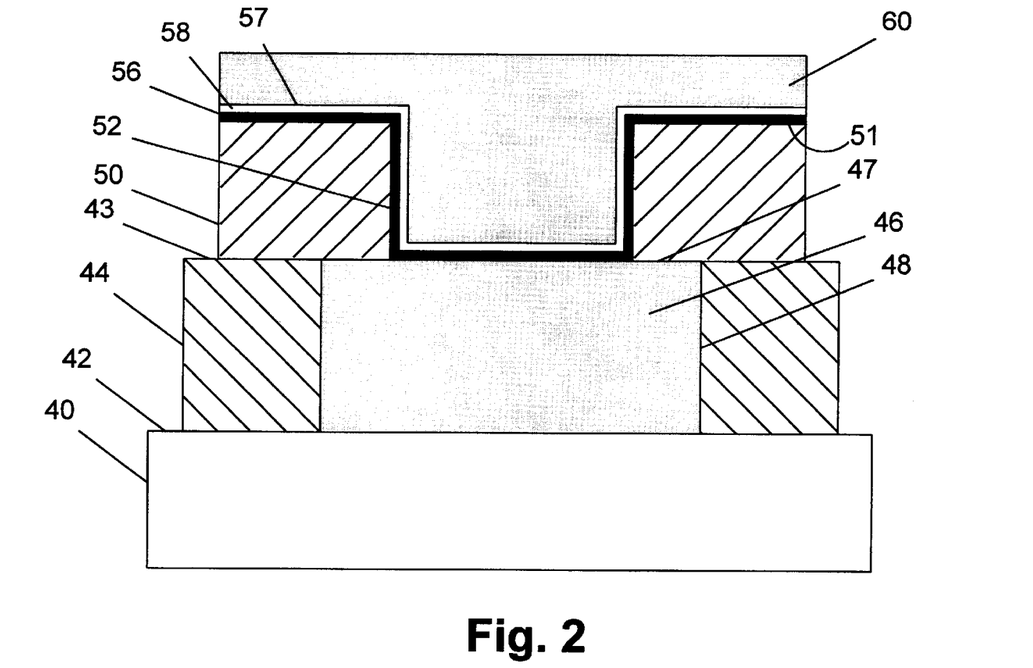
FIG. 2 is an enlarged, cross-sectional view of an illustrative conductive line and contact used in a semiconductor device.
Figure 3:
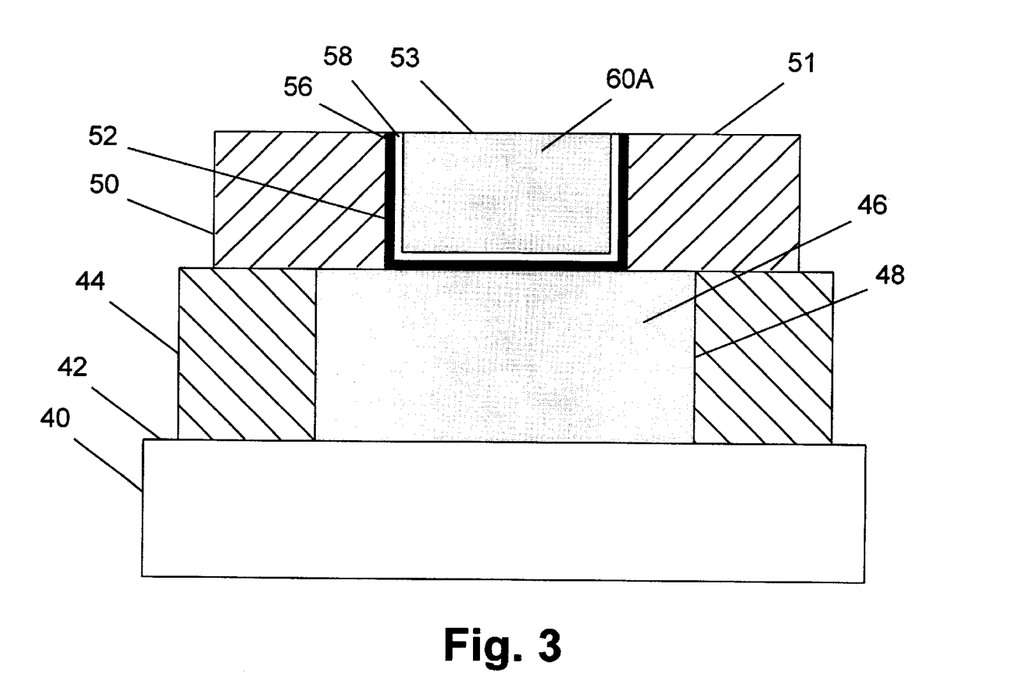
FIG. 3 is a cross-sectional view of the device shown in FIG. 2 after it has been subjected to a planarization operation.

FIGS. 2 and 3 are cross-sectional views depicting one illustrative process flow used to form illustrative conductive lines and plugs above a structure 40. The structure 40 may be a semiconducting substrate, or it may represent some other previously formed structure, i.e., another layer of metallization. As shown in FIG. 2, a first insulation layer 44 is formed above a surface 42 of the structure 40. The first insulation layer 44 may be formed of a variety of insulating type materials, e.g., an oxide, an oxynitride, silicon dioxide, silicon oxynitride, or any other material sufficient to serve the insulative purpose of the first insulation layer 44. Thereafter, an opening 48 is formed in the first insulation layer 44 by performing one or more traditional etching processes, e.g., an anisotropic etching process.

An illustrative conductive line 46 may then be formed in the opening 48. The conductive line 46 may be comprised of a variety of conductive metals, e.g., aluminum, copper, tungsten, etc., and the conductive line 46 may be formed by a variety of techniques. For example, the conductive line 46 may be formed by blanket-depositing a layer of the appropriate material, (not shown) e.g., aluminum, above a surface 43 of the first insulation layer 44 and into the opening 48. Thereafter, a planarization operation may be performed such that a surface 47 of the conductive line 46 is approximately planar with the surface 43 of the first insulation layer 44. The conductive lines and plugs may also be formed by a single or dual damascene process.

Next, as shown in FIG. 2, a second insulation layer 50 is formed above the first insulation layer 44 and conductive line 46. As with the first insulation layer 44, the second insulation layer 50 may be comprised of similar type materials useful for performing the intended function. An opening 52 is formed in the second insulation layer 50 by performing one or more etching processes, e.g., an anisotropic etching process. The particular configuration of the opening 52 may be varied as a matter of design choice, i.e., it may be circular or rectangular or even square in cross-section, depending upon the desired shape of the resulting plug to be formed therein. After the opening 52 is formed, a titanium nitride layer 56 is formed above a surface 51 of the second insulation layer 50 and in the opening 52. The titanium nitride layer 56 may be formed by a variety of processes, such as a chemical vapor deposition process, and it may have a thickness ranging from approximately 50–200 Å. Moreover, various precursors may be used in connection with the formation of the titanium nitride layer 56, e.g., TDMAT.

After the layer of titanium nitride 56 is formed, it is subjected to a plasma process to remove undesirable materials from the layer of titanium nitride 56. For example, the plasma process may be used to remove materials, such as carbon, that is a remnant of the precursor materials used in forming the layer of titanium nitride 56. The parameters of the plasma treatment may vary, but it typically is performed for a duration ranging from approximately 25–40 seconds at a temperature ranging from approximately 375–475° C. This plasma treatment process may be performed in the same tool in which the layer of titanium nitride 56 is formed, or it may be performed in a separate, stand-alone tool.

Next, as indicated in FIG. 2, a layer of an adhesion material 58, such as tungsten, is formed above the layer of titanium nitride 56. The adhesion layer 58 may be formed by a CVD process, and it may have a thickness ranging from approximately 3,000–10,000 Å. Thereafter, as shown in FIG. 2, a metal layer 60 is formed above a surface 57 of the adhesion layer 58 and into the now-lined opening 52. The metal layer 60 may be comprised of a variety of materials, such as, for example, aluminum, tungsten, copper, etc. Moreover, the metal layer 60 may be formed by blanket-depositing a layer of the material using a CVD or PVD type process. Thereafter, as indicated in FIG. 3, a planarization operation is performed to define a conductive plug 60A. That is, a planarization operation is performed such that a surface 53 of the conductive plug 60A is approximately planar with the surface 51 of the second insulation layer 50.

In general, the present invention is directed to sensing the thickness of the layer of titanium nitride 56, providing the sensed thickness to a controller, and using the sensed thickness for controlling one or more parameters of a plasma process to be performed on one or more layers of titaniwn nitride. Parameters of the plasma treatment process, such as the duration of the process, the temperature of the process, etc., may be varied based upon the determined thickness of the layer of titanium nitride 56. For example, if the determined thickness of the layer of titanium nitride 56 is less than anticipated, the duration of the plasma treatment process may be decreased. Conversely, if the layer of titanium nitride 56 is thicker than anticipated, the duration of the plasma treatment process may be increased. Of course, the present invention may be used to control more than one parameter of the plasma treatment process. For example, in a process recipe used for the plasma treatment process, both the duration of the process and the temperature of the process may be varied.

Figure 4:
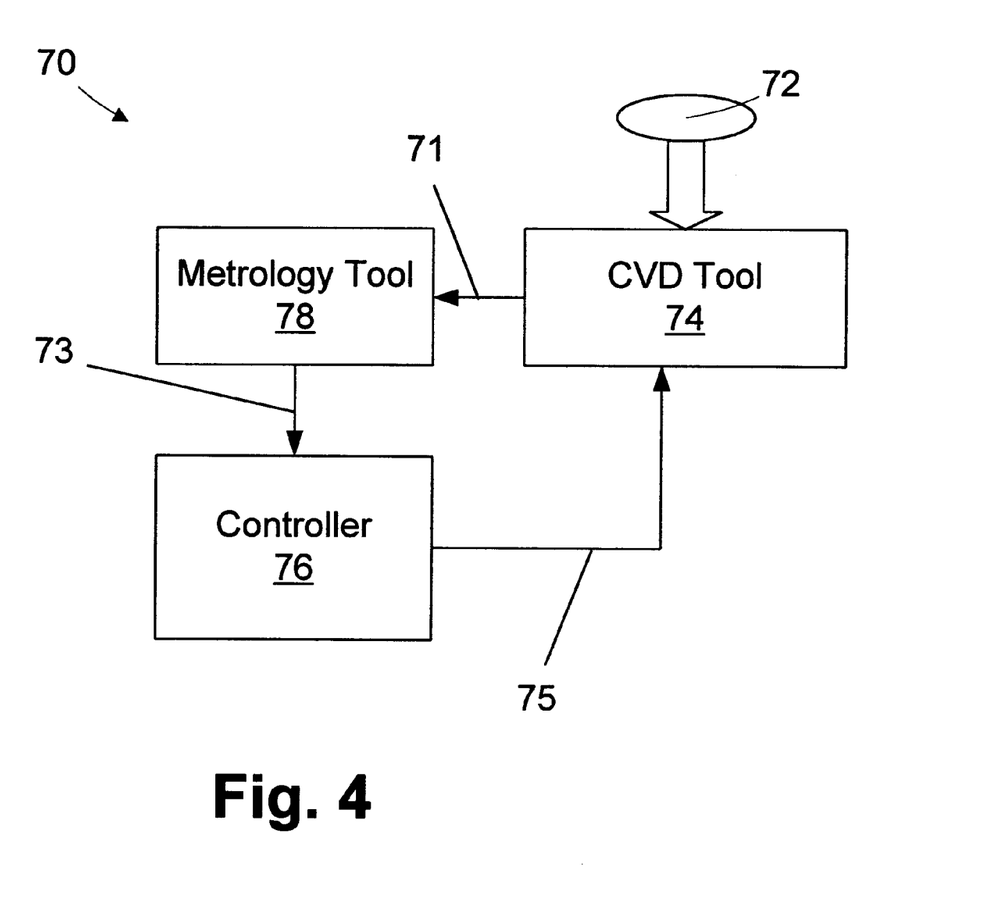
FIG. 4 is an illustrative embodiment of a system that may be used with the present invention.

FIG. 4 depicts one illustrative embodiment of a system 70 that may be used with the present invention. As shown therein, the system 70 for processing wafers 72 is comprised of a CVD tool 74, a metrology tool 78, and an automatic process controller 76. The metrology tool 78 is used to measure or sense the thickness of a layer of titanium nitride 56 formed by the CVD tool 74. In the illustrative system 70 depicted in FIG. 4, it is assumed that the plasma treatment process to be performed on the layer of titanium nitride 56 is performed in the CVD tool 74. If the plasma treatment process is performed in a separate tool (not shown), then the automated process controller 76 would also be able to communicate with that tool.

The metrology tool 78 may be any type of device that may be used in measuring or determining the thickness of the layer of titanium nitride 56, e.g., an acoustic measurement system, a system that measures the resistivity of the layer of titanium nitride 56, etc. For example, the metrology tool 78 may be an acoustic measurement system, such as Metapulse, manufactured by Rudolph Technologies. More than one metrology tool 78 may be used with the present invention if desired. Moreover, the metrology tool 78 may be a stand-alone device, or it may be resident on the CVD tool 74, or another process tool (not shown) where the plasma treatment of the layer of titanium nitride 56 will be performed.

The CVD tool 74 is used to form the layer of titanium nitride 56. The CVD tool 74 may be any tool useful for forming such layers of titanium nitride, e.g., an Endura PVD/CVD system manufactured by Applied Materials.

In one embodiment, the automated process controller 76 interfaces with the metrology tool 78 to control, determine or vary one or more parameters of the plasma process to be performed on the layer of titanium nitride 56. That is, the controller 76 may be used to control, determine or vary parameters such as the duration and/or temperature of the plasma process. In particular, the thickness of the layer of titanium nitride 56 is sensed by the metrology tool 78, via line 71, and that information is supplied to the controller 76, via line 73. Thereafter, the controller 76 determines, controls and/or varies one or more parameters of the plasma treatment process to be performed on either the measured layer of titanium nitride 56, or on layers of titanium nitride formed on subsequently processed wafers. That is, the thickness of the measured layer of titanium nitride 56 is fed forward to the controller 76, and one or more parameters of the plasma treatment process to be performed on subsequent wafers are controlled based upon this sensed thickness of the measured layer of titanium nitride 56. For example, if the thickness of the layer of titanium nitride 56 is less than desired, the duration of the plasma treatment process may be decreased. Conversely, if the thickness of the layer of titanium nitride 56 is greater than desired, the duration of the plasma treatment process may be increased.

The present invention may be employed on a lot-by-lot basis and/or on a wafer-by-wafer basis. That is, the present invention may be employed such that the thickness of the layer of titanium nitride on each wafer is sensed, and the plasma treatment process for each layer is based upon the sensed thickness for that particular layer. Alternatively, the present invention may be employed on a periodic, or otherwise statistically sufficient, basis to determine the thickness of layers of titanium nitride manufactured by a given CVD tool using a given process recipe. This determined thickness, which may be an average thickness of all layers measured, may then be used to control, vary or determine one or more parameters of the plasma treatment process to be performed on layers of titanium nitride on subsequently processed wafers or lots of wafers. Moreover, the number of layers measured may be varied depending upon the desired degree of accuracy. In general, the more frequent the measurements, the more accurate will be the adjustment to the plasma process used on the layers of titanium nitride.

In the illustrated embodiment, the automatic process controller 76 is a computer programmed with software to implement the functions described. However, as will be appreciated by those of ordinary skill in the art, a hardware controller (not shown) designed to implement the particular functions may also be used. Moreover, the functions of the controller described herein may be performed by one or more processing units that may or may not be geographically dispersed. Portions of the invention and corresponding detailed description are presented in terms of software, or algorithms and symbolic representations of operations on data bits within a computer memory. These descriptions and representations are the ones by which those of ordinary skill in the art effectively convey the substance of their work to others of ordinary skill in the art. An algorithm, as the term is used here, and as it is used generally, is conceived to be a self-consistent sequence of steps leading to a desired result. The steps are those requiring physical manipulations of physical quantities. Usually, though not necessarily, these quantities take the form of optical, electrical, or magnetic signals capable of being stored, transferred, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise, or as is apparent from the discussion, terms such as "processing"

or "computing" or "calculating" or "determining" or "displaying" or the like, refer to the actions and processes of a computer system, or similar electronic computing device, that manipulates and transforms data represented as physical, electronic quantities within the computer system's registers and memories into other data similarly represented as physical quantities within the computer system memories or registers or other such information storage, transmission or display devices.

An exemplary software system capable of being adapted to perform the functions of the automatic process controller 36, as described, is the ObjectSpace Catalyst system offered by ObjectSpace, Inc. The ObjectSpace Catalyst system uses Semiconductor Equipment and Materials International (SEMI) Computer Integrated Manufacturing (CIM) Framework compliant system technologies, and is based on the Advanced Process Control (APC) Framework. CIM (SEMI E81-0699—Provisional Specification for CIM Framework Domain Architecture) and APC (SEMI E93-0999—Provisional Specification for CIM Framework Advanced Process Control Component) specifications are publicly available from SEMI.

Figure 5:
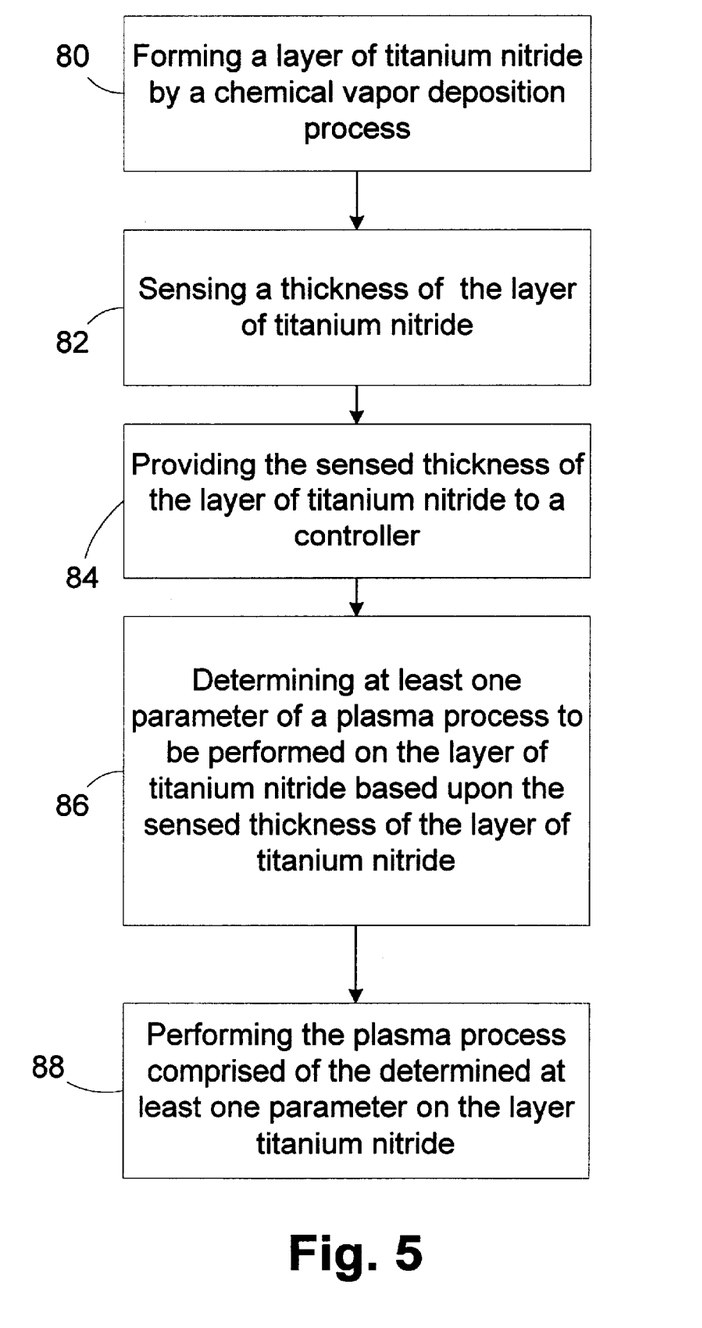
FIG. 5 is a flowchart depicting one illustrative embodiment of the present invention.

Referring to FIG. 5, an illustrative embodiment of the present invention is depicted in flowchart form. As shown therein, the present invention comprises forming the layer of titanium nitride by a chemical vapor deposition process, as set forth at block 80, sensing a thickness of the layer of titanium nitride, as recited at block 82, and providing the sensed thickness of the layer of titanium nitride to the controller, as indicated at block 84. The method further comprises determining at least one parameter of a plasma process to be performed on the layer of titanium nitride based upon the sensed thickness of the layer of titanium nitride, as set forth at block 86, and performing the plasma process comprised of the determined parameter on the layer of titanium nitride, as indicated at block 88.

The step of forming the layer of titanium nitride, as set forth at block 80, may be performed by any tool, and using any process, for forming such layers. For example, a CVD tool such as that manufactured by Applied Materials may be used with the present invention.

Sensing the thickness of the layer of titanium nitride, as recited at block 82, may be accomplished by any metrology tool capable of sensing or measuring such a thickness. As set forth previously, one illustrative metrology tool that may be used for this purpose is a Randolph Technologies Metapulse tool. Moreover, although one such metrology tool 78 is schematically depicted in the disclosed embodiment, more than one such tool may be used if desired or deemed necessary. This sensed thickness is then provided to the controller, as described at block 84.

Next, as set forth in block 86, the present method involves determining at least one parameter of a plasma process to be performed on the layer of titanium nitride based upon the sensed thickness of the layer of titanium nitride. Any of a variety of parameters of the plasma process may be determined, varied or adjusted, e.g., the duration and/or temperature of the plasma treatment process. Additionally, the present invention may be used in situations where more than one parameter of the plasma treatment process is varied or adjusted.

As set forth in block 86, the step of determining at least one parameter of a plasma treatment process to be performed on the layer of titanium nitride based upon the sensed thickness of the layer of titanium nitride may be performed by a variety of techniques. For example, a database may be developed that correlates the sensed thickness of the layer of titanium nitride to one or more corresponding parameters of the plasma treatment process to be performed on one or more layers of titanium nitride. Alternatively, one or more parameters of the plasma treatment process may be calculated using a formula based upon the sensed thickness of the layer of titanium nitride. Other methodologies are also possible.

Lastly, as set forth at block 88, the present invention comprises performing the plasma treatment process comprised of at least one of the determined parameters. The present invention may be employed on either a lot-by-lot basis or on a wafer-by-wafer basis. Through use of the present invention, the formation of acceptable layers of titanium nitride may be more precisely controlled. More particularly, the present invention provides a method to better control the resistance of a titanium nitride layer used in forming a barrier layer for conductive interconnections. This helps to insure that device operating speeds are not degraded.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A method, comprising:

forming a layer of titanium nitride by a chemical vapor deposition process;

sensing a thickness of the layer of titanium nitride;

determining at least one parameter of a post-chemical vapor deposition plasma process to be performed on said layer of titanium nitride based upon said sensed thickness of said layer of titanium nitride; and performing said plasma process based upon said at least one parameter of said plasma process.

2. The method of claim 1, wherein sensing a thickness of the layer of titanium nitride comprises acoustically sensing a thickness of the layer of titanium nitride.

3. The method of claim 1, wherein sensing a thickness of the layer of titanium nitride comprises sensing a thickness of the layer of titanium nitride by measuring the resistance of said layer of titanium nitride.

4. The method of claim 1, further comprising providing the sensed thickness of the layer of titanium nitride to a controller.

5. The method of claim 1, wherein providing the sensed thickness of the layer of titanium nitride to a controller comprises providing the sensed thickness of the layer of titanium nitride to a controller that is resident on a chemical vapor deposition tool.

6. The method of claim 1, wherein determining at least one parameter of a plasma process to be performed on said layer of titanium nitride based upon said sensed thickness of said layer of titanium nitride comprises determining at least one of a duration and a temperature of a plasma process to be performed on said layer of titanium nitride based upon said sensed thickness of said layer of titanium nitride.

7. The method of claim 1, wherein determining at least one parameter of a plasma process to be performed on said layer of titanium nitride based upon said sensed thickness of said layer of titanium nitride comprises calculating at least one parameter of a plasma process to be performed on said layer of titanium nitride based upon said sensed thickness of said layer of titanium nitride.

8. The method of claim 1, wherein determining at least one parameter of a plasma process to be performed on said layer of titanium nitride based upon said sensed thickness of said layer of titanium nitride comprises correlating at least one parameter of a plasma process to be performed on said layer of titanium nitride with said sensed thickness of said layer of titanium nitride.

9. A method, comprising:
 forming a first layer of titanium nitride by a chemical vapor deposition process;
 sensing a thickness of the first layer of titanium nitride;
 determining at least one parameter of a post-chemical vapor deposition plasma process to be performed on a second layer of titanium nitride based upon said sensed thickness of said first layer of titanium nitride; and
 performing said plasma process based upon said at least one parameter of said plasma process to be performed on said second layer of titanium nitride.

10. The method of claim 9, wherein sensing a thickness of the first layer of titanium nitride comprises acoustically sensing a thickness of the first layer of titanium nitride.

11. The method of claim 9, wherein sensing a thickness of the first layer of titanium nitride comprises sensing a thickness of the first layer of titanium nitride by measuring the resistance of said first layer of titanium nitride.

12. The method of claim 9, further comprising providing the sensed thickness of the first layer of titanium nitride to a controller, the controller being adapted to be a stand-alone controller.

13. The method of claim 9, wherein providing the sensed thickness of the first layer of titanium nitride to a controller comprises providing the sensed thickness of the first layer of titanium nitride to a controller that is resident on a chemical vapor deposition tool.

14. The method of claim 9, wherein determining at least one parameter of a plasma process to be performed on a second layer of titanium nitride based upon said sensed thickness of said first layer of titanium nitride comprises determining at least one of a duration and a temperature of a plasma process to be performed on a second layer of titanium nitride based upon said sensed thickness of said first layer of titanium nitride.

15. The method of claim 9, wherein determining at least one parameter of a plasma process to be performed on a second layer of titanium nitride based upon said sensed thickness of said first layer of titanium nitride comprises calculating at least one parameter of a plasma process to be performed on a second layer of titanium nitride based upon said sensed thickness of said first layer of titanium nitride.

16. The method of claim 9, wherein determining at least one parameter of a plasma process to be performed on a second layer of titanium nitride based upon said sensed thickness of said first layer of titanium nitride comprises correlating at least one parameter of a plasma process to be performed on a second layer of titanium nitride with said sensed thickness of said first layer of titanium nitride.

17. A method, comprising:
 forming a first layer of titanium nitride by a chemical vapor deposition process;
 sensing a thickness of the first layer of titanium nitride;
 determining at least one of a duration and a temperature of a post-chemical vapor deposition plasma process to be performed on a second layer of titanium nitride based upon said sensed thickness of said first layer of titanium nitride; and
 performing said plasma process based upon at least one of duration and said temperature.

18. The method of claim 17, wherein sensing a thickness of the first layer of titanium nitride comprises acoustically sensing a thickness of the first layer of titanium nitride.

19. The method of claim 17, wherein sensing a thickness of the first layer of titanium nitride comprises sensing a thickness of the first layer of titanium nitride by measuring the resistance of said first layer of titanium nitride.

20. The method of claim 17, further comprising providing the sensed thickness of the first layer of titanium nitride to a controller, the controller being adapted to be a stand-alone controller.

21. The method of claim 17, wherein providing the sensed thickness of the first layer of titanium nitride to a controller comprises providing the sensed thickness of the first layer of titanium nitride to a controller that is resident on a chemical vapor deposition tool.

22. The method of claim 17, wherein determining at least one of a duration and a temperature of a plasma process to be performed on a second layer of titanium nitride based upon said sensed thickness of said first layer of titanium nitride comprises calculating at least one of a duration and a temperature of a plasma process to be performed on a second layer of titanium nitride based upon said sensed thickness of said first layer of titanium nitride.

23. The method of claim 17, wherein determining at least one of a duration and a temperature of a plasma process to be performed on a second layer of titanium nitride based upon said sensed thickness of said first layer of titanium nitride comprises correlating at least one of a duration and a temperature of a plasma process to be performed on a second layer of titanium nitride with said sensed thickness of said first layer of titanium nitride.

* * * * *

UNITED STATES PATENT AND TRADEMARK OFFICE
CERTIFICATE OF CORRECTION

PATENT NO. : 6,558,963 B1  Page 1 of 1
DATED : May 6, 2003
INVENTOR(S) : Allen Lewis Evans and H. Jim Fulford It is certified that error appears in the above-identified patent and that said Letters Patent is hereby corrected as shown below:

Column 5,
Line 17, replace "titaniwn" with -- titanium --.

Signed and Sealed this

Twenty-ninth Day of July, 2003

JAMES E. ROGAN
*Director of the United States Patent and Trademark Office*